(12) United States Patent
Gill et al.

(10) Patent No.: US 6,280,909 B1
(45) Date of Patent: Aug. 28, 2001

(54) ELECTROLUMINESCENT DISPLAY SCREEN FOR DISPLAYING FIXED AND SEGMENTED PATTERNS, AND METHOD OF MANUFACTURING SUCH AN ELECTROLUMINESCENT DISPLAY SCREEN

(75) Inventors: Richard E. Gill; Coen T. H. F. Liedenbaum; Maria C. Wuijts, all of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/489,749

(22) Filed: Jan. 21, 2000

(30) Foreign Application Priority Data

Jan. 22, 1999 (EP) .................................................. 99200189

(51) Int. Cl.⁷ ....................................................... H01J 1/62
(52) U.S. Cl. .......................... 430/317; 430/318; 430/319; 313/504; 313/510
(58) Field of Search .................................... 430/321, 314, 430/318, 319, 317; 313/504, 510

(56) References Cited

U.S. PATENT DOCUMENTS 5,399,936 * 3/1995 Namiki et al. ......................... 313/504
6,069,443 * 5/2000 Jones et al. ............................ 313/504

FOREIGN PATENT DOCUMENTS 10-199680 * 7/1998 (JP) .
WO9803043 1/1998 (WO) .

* cited by examiner

Primary Examiner—John A. McPherson
(74) Attorney, Agent, or Firm—Aaron Waxler

(57) ABSTRACT

Electroluminescent display screen having a transparent substrate (1), a surface (2) of which is provided with a first, transparent electrode layer (3) on which a metal top layer (12) is formed. The metal top layer is provided with a layer of insulating material (4). Windows (5) in accordance with a pattern (8, 9, 10) to be displayed are formed in the layer of insulating material as well as in the metal top layer. An organic electroluminescent layer (6) is deposited on said layer of insulating material and in said windows. This layer is provided with a second electrode layer (7). Said pattern (8, 9, 10) can be displayed without differences in brightness.

8 Claims, 2 Drawing Sheets

ELECTROLUMINESCENT DISPLAY SCREEN FOR DISPLAYING FIXED AND SEGMENTED PATTERNS, AND METHOD OF MANUFACTURING SUCH AN ELECTROLUMINESCENT DISPLAY SCREEN

BACKGROUND OF THE INVENTION

The invention relates to an electroluminescent display screen having a transparent substrate, a surface of which is provided with a first, transparent electrode layer, with a layer of insulating material in which windows within which the first electrode layer is exposed are formed in accordance with a pattern to be displayed, with a layer of an organic electroluminescent material which is provided on the layer of insulating material and, within the windows in the layer of insulating material, on the first electrode layer, and with a second electrode layer which is provided on the layer of electroluminescent material. The invention also relates to a method of manufacturing such an electroluminescent display screen.

During operation of such a display screen, an electric current flows from the first electrode layer through the windows in the layer of insulating material to the second electrode layer. The layer of electroluminescent material then luminesces in accordance with the pattern formed in the layer of insulating material, which pattern is then visible through the transparent substrate. Patterns formed in the layer of insulating material can thus be displayed. A display screen of this type may be used, for example, in mobile telephones or watches, or in car or plane instrument panels. The pattern may be, for example, a word, a number or an icon.

A display screen of the type described in the opening paragraph is known from WO 98/03043, in which the first, transparent electrode layer is a layer of ITO (indium tin oxide) and the layer of insulating material is a layer of a positive photoresist. The photoresist is exposed in accordance with the pattern to be displayed and is subsequently developed, with the desired pattern being formed in the layer of insulating material. The layer of electroluminescent material, which consists of a customary double layer of an organic electroluminescent material, is deposited on the photoresist and, in the windows in the photoresist, on the first electrode layer. The second electrode layer consists of a layer of magnesium coated with a layer of silver. The insulating layer is also provided with a window which leaves open a bond pad of the first electrode layer for external contacting of the first electrode layer. This bond pad is located at the edge of the substrate, next to the pattern to be displayed. This bond pad is shielded by a mask during the deposition of the layer of electroluminescent material and the second layer of electrode material.

It has been found in practice that a pattern to be displayed may exhibit local differences in brightness during display. These differences particularly become manifest when the pattern to be displayed is, for example, a relatively large word or icon.

OBJECTS AND SUMMARY OF THE INVENTION

It is, inter alia, an object of the invention to provide an electroluminescent display screen in which no local differences in brightness occur in the pattern during display of this pattern, even if this pattern is a relatively large word or icon.

According to the invention, the display screen as described in the opening paragraph is therefore characterized in that the first electrode layer is provided with a top layer of metal on which the layer of insulating material is present, while the windows are formed both in the layer of insulating material and in the metal top layer.

During operation of the display screen, electric currents flow from the bond pad through the first electrode layer and then through the windows in the layer of insulating material to the second electrode layer. In the case of relatively large patterns, the different windows of the pattern to be displayed are located at distances from the connection electrode, which distances have relatively large differences. Since the first electrode layer of ITO in the known display screen has a relatively large resistivity, these different distances represent electrical resistances which differ from each other. These differences may be so large that the electric currents flowing through the different windows also have relatively large differences. This leads to said local differences in brightness. By providing a metal top layer on the first electrode layer, the differences between said electrical resistances are eliminated. The occurrence of local differences in brightness is thereby inhibited.

In a preferred embodiment of a display screen according to the invention, a pattern of mutually isolated segments is formed in the first electrode layer and the metal top layer, and the windows in the insulating layer and the top layer are provided at the area of the segments. A pattern to be displayed can thus be formed at the area of each segment. The display screen is extremely suitable for use in an instrument panel for cars or airplanes. The display screen may comprise a number of segments with icons indicating, for example, which light has been switched on. It may also comprise segments with words giving, for example, a warning such as "fasten your seatbelts". A number of groups of seven segments arranged in the conventional manner may also be added for displaying characters alternating with figures, with which, for example, speed, number of revolutions and temperature can be indicated. Due to the metal top layer provided on the first electrode layer, a display screen can be made on which a large number of these icons, words and changing characters and with figures are displayed with equal brightness.

The occurrence of differences in brightness within a pattern to be displayed is even further inhibited when an edge of the segments is covered by the metal top layer and the layer of insulating material.

The segments may be externally contacted in a simple manner when also a pattern of bond pads and conductor tracks is formed in the first electrode layer and the metal top layer, each conductor track connecting one of the bond pads to one of the segments. Since the external contact is established with the metal top layer, voltage loss between an external voltage source and the pattern to be displayed is avoided as much as possible.

The invention also relates to a method of manufacturing a display screen of the type described in the opening paragraph, in which a first, transparent electrode layer is provided on a surface of a plane substrate, whereafter a layer of insulating material is provided in which windows within which the first electrode layer is exposed are formed in accordance with a pattern to be displayed, whereafter a layer of an organic electroluminescent material is deposited on the layer of insulating material and, within the windows in the layer of insulating material, on the first electrode layer, and subsequently a second electrode layer is deposited on the layer of electroluminescent material.

To suppress local differences in brightness when displaying the pattern to be displayed, the first electrode layer is provided with a metal top layer on which the layer of insulating material is present, with the windows being formed both in the layer of insulating material and in the top layer. According to the invention, this is realized in a simple manner in that, prior to depositing the layer of insulating material, the first, transparent electrode layer is first coated with a metal top layer, whereafter the layer of insulating material is provided on the metal top layer, and subsequently the windows are formed in the layer of insulating material and also in the metal top layer.

A pattern of mutually isolated segments is preferably formed in the first electrode layer and in the metal top layer, with the windows being formed in the layer of insulating material at the area of the segments. The display screen is then eminently suitable for use in car and airplane instrument panels. According to the invention, this is easily realized in that, after the first electrode layer is coated with the metal top layer, a pattern of mutually isolated segments is formed in the electrode layer and the metal top layer, between which segments the surface of the substrate is exposed, whereafter the layer of insulating material is deposited on and between the segments, and windows in accordance with the pattern to be displayed are formed at the area of the segments in the layer of insulating material.

When forming the windows, an edge of the segments is covered by the metal top layer and the layer of insulating material. A pattern of bond pads and conductor tracks is preferably also formed in the first electrode layer and the metal top layer, with each conductor track connecting one of the bond pads to one of the segments. Both the bond pads and the conductor tracks then have a relatively low electrical resistance.

These and other aspects of the invention are apparent from and will be elucidated with reference to the embodiments described hereinafter.

DESCRIPTION OF THE PREFERRED EMBODIMENTS

Figure 1:
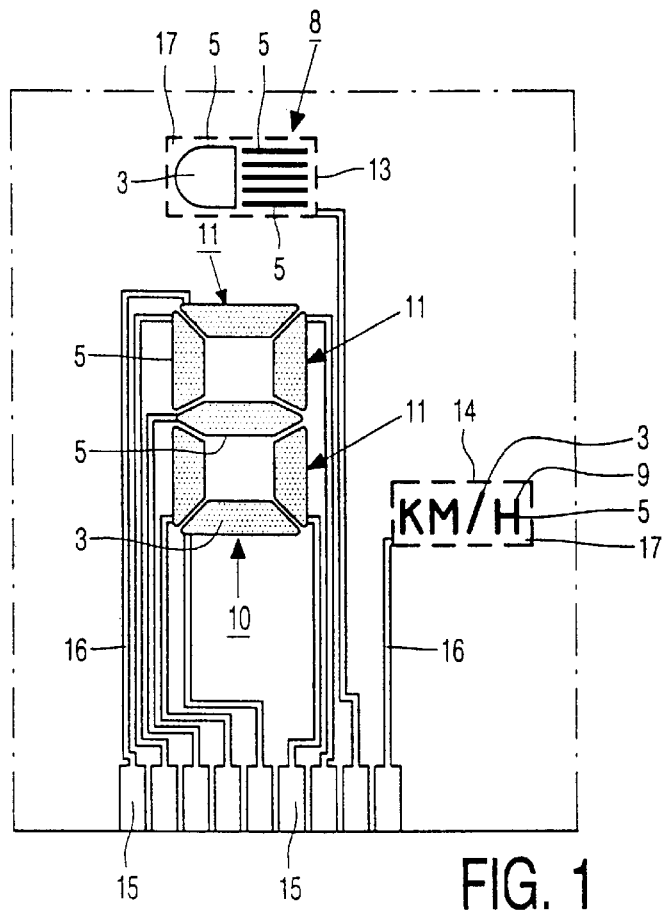
FIG. 1 is a diagrammatic elevational view of a part of a display screen according to the invention.
Figure 2:
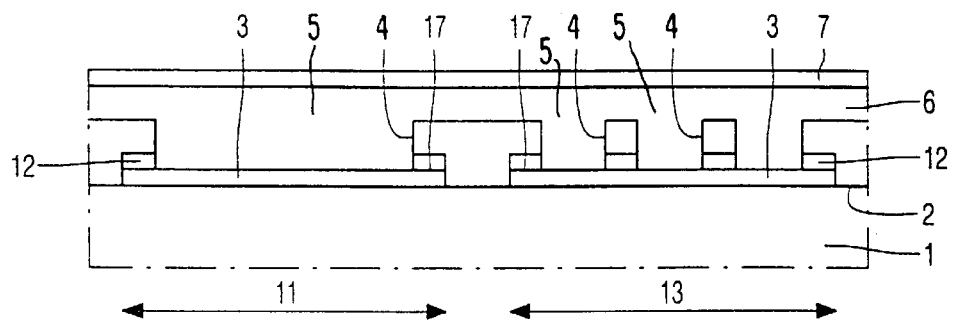
FIGS. 2 and 3 are diagrammatic cross-sections of parts of the display screen shown in FIG. 1, and FIGS. 4 to 7 are diagrammatic cross-sections of some stages of manufacture of the display screen shown in FIG. 1.
Figure 3:
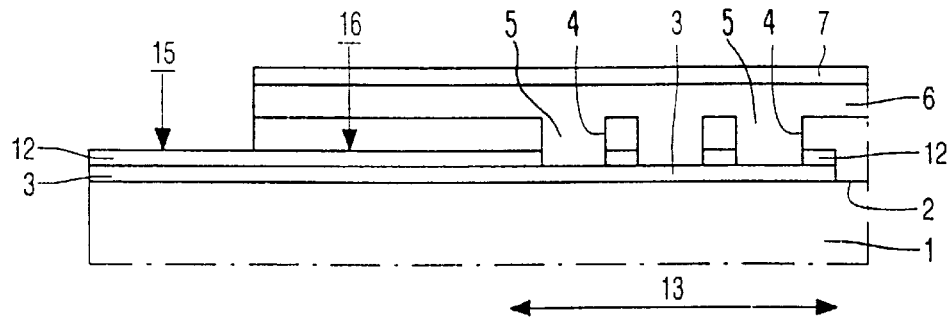
Figure 4:
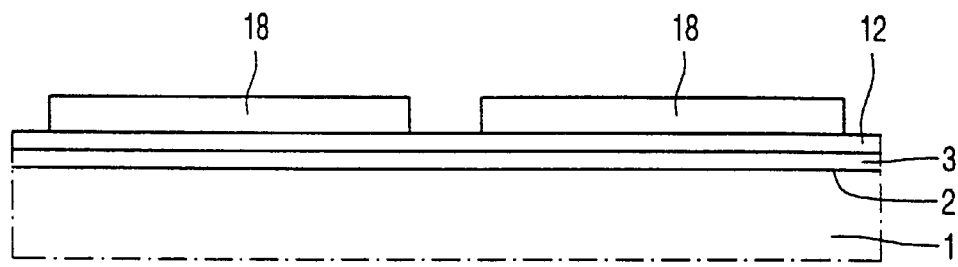
Figure 5:
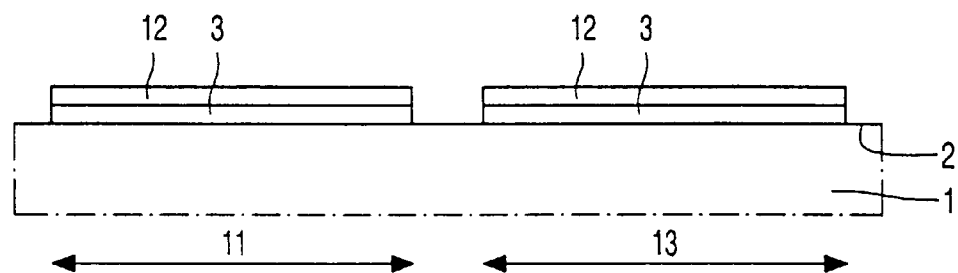
Figure 6:
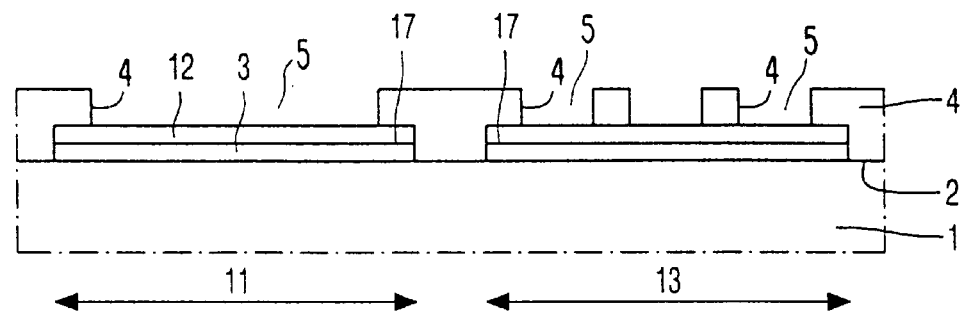
Figure 7:
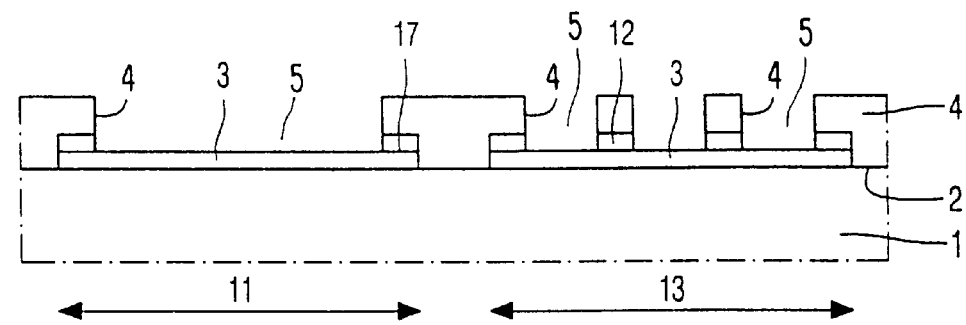

FIG. 1 is a diagrammatic elevational view of an electroluminescent display screen having a transparent substrate 1, shown in several cross-sections in FIGS. 2 and 3. In this embodiment, the display screen comprises an approx. 1 mm thick plate of glass, a surface 2 of which is provided with a first, transparent electrode layer 3, in this embodiment a conventional, approx. 150 nm thick layer of ITO (indium tin oxide). The display screen also comprises a layer of insulating material 4 in which windows 5 are formed in accordance with a pattern to be displayed, within which windows the first electrode layer 3 is exposed. A layer of an organic electroluminescent material 6 is provided on the layer of insulating material 4 and, within the windows 5, on the first electrode layer 3. A second electrode layer 7 is provided on the layer of electroluminescent material 6.

During operation of the display screen, an electric current flows from the first electrode layer 3 through the windows 5 in the layer of insulating material 4 to the second electrode layer 7. The layer of electroluminescent material 6 then luminesces in accordance with the pattern formed in the layer of insulating material 4, which pattern is then visible through the transparent substrate 1. FIG. 1 shows some of these patterns 8, 9, 10 in a plan view. The windows 5 and the first electrode layer 3 which is visible through the windows are indicated. The display screen may be used, for example, in a motorcar instrument panel. The pattern 8 is an icon indicating, for example, that the car lamps have been switched on. The pattern 9 is a word. The pattern 10 is a conventional pattern consisting of seven segments 11 and intended for displaying alternating numbers. The example shown is only a part of such an instrument panel which may comprise many patterns of this type.

The first electrode layer 3 is provided with a metal top layer 12 on which the layer of insulating material 4 is present, the windows 5 being formed both in the layer of insulating material 4 and in the top layer 12 of metal. In this embodiment, the top layer 12 is an approx. 500 nm thick layer of chromium or an approx. 100 nm thick layer of a nickel chromium alloy coated with an approx. 200 nm thick layer of copper. In the second case, the nickel chromium layer ensures a good adhesion to the ITO and the layer of copper ensures a low resistance of the top layer 12.

A pattern of mutually isolated segments 11, 13, 14 is formed in the first electrode layer 3 and the metal top layer 12, and the windows 5 in the insulating layer 4 and the top layer 12 are provided at the area of the segments 11, 13, 14. A pattern to be displayed can thus be formed at the area of each segment. This renders the display screen eminently suitable for use in instrument panels for motorcars or aircraft.

FIG. 1 shows, in addition to the patterns 8, 9 and 10, bond pads 15 and conductor tracks 16 connecting each bond pad to a segment 11, 12, 13. During operation of the display screen, electric currents flow from a bond pad 15 through a conductor track 16, through the first electrode layer 3, and then through the windows 5 in the layer of insulating material 4 to the second electrode layer 7. For relatively large patterns, such as the patterns 8 and 9, the different windows 5 of the pattern to be displayed are located at distances from the point where the conductor track 16 is connected to the segment 13, 14, which distances show relatively great differences. Without a top layer, these different distances would represent electrical resistances differing from each other. These differences may be so large that the electric currents flowing through the different windows also exhibit relatively large differences. During operation, this may lead to local differences in brightness. By providing a metal top layer 12 on the first electrode layer 3, the differences between said electrical resistances are strongly reduced. The occurrence of local differences in brightness is thereby inhibited.

To inhibit said differences in brightness to a further extent, an edge 17 of the segments 11, 13, 14 is covered by the metal top layer 12 and by the layer of insulating material 4.

The segments 11, 13, 14 may be externally contacted in a simple manner when a pattern of bond pads 15 and conductor tracks 16 is also formed in the first electrode layer 3 and the metal top layer 12, while each conductor track 16 connects one of the bond pads 15 to one of the segments 11, 13, 14. Since the external contact is made with the metal top layer 12, voltage loss between an external voltage source and the pattern to be displayed is avoided as much as possible.

FIGS. 4 to 7 show some stages of manufacture of the display screen shown in FIG. 1, particularly the cross-section in FIG. 2. A first, transparent electrode layer 3 is provided on a surface 2 of a plane substrate 1. This is said approx. 150 nm thick layer of ITO. The first electrode layer 3 is subsequently provided with a metal top layer 12. This is said approx. 500 nn thick layer of chromium. Mutually isolated segments 11, 13, 14 are formed in the first electrode layer 3 and in the top layer 12 by means of a first, conventional photoresist mask 18.

After removal of the photoresist mask 18, a layer of insulating material 4 is provided on and between the segments 11, 13, 14. In this embodiment, this layer is a customary photoresist layer in which windows 5 are formed in the conventional manner in accordance with a pattern to be displayed. After development, the photoresist layer is heated at 120° C. for about 15 minutes. The windows 5 are also formed in a metal top layer 12. Within the windows 5, the first electrode layer 3 is exposed.

The layer of insulating material 4 may also consist of a customary insulating material such as, for example, silicon oxide, silicon nitride, or a synthetic material such as polyimide. The pattern is then formed in the layer 4 by means of a conventional photolithographic process.

As is shown in FIG. 2, a layer of an organic electroluminescent material 6 is deposited on the layer of insulating material 4 and, within the windows 5, on the first electrode layer 3, and a second electrode layer 7 is deposited on the layer of electroluminescent material 6. In this embodiment, the layer of electroluminescent material is a double layer consisting of an approx. 200 nm thick sub-layer of polyethylene dioxythiophene and an approx. 100 nm thick top layer of poly(para)phenylene vinylene. These layers are spin-coated. After spincoating the sub-layer, it is cured by heating it to a temperature of approx. 200° C. In this embodiment, the second electrode layer 7 is an approx. 30 nm thick sub-layer of calcium with an approx. 500 nm thick layer of aluminum. The layer of calcium serves for injecting electrons into the electroluminescent material and the layer of aluminum ensures that the second electrode layer has a low electrical resistance.

Since a pattern of mutually isolated segments 11, 13, 14 is formed in the first electrode layer 3 and in the metal top layer 12, different patterns to be displayed can be realized on the display screen. The display screen is thus suitable for use in instrument panels for motorcars and aircraft.

When forming the windows 5, an edge 17 of the segments 11, 13, 14 is covered by the metal top layer 12 and the layer of insulating material 4. Moreover, a pattern of bond pads 15 and conductor tracks 16 is formed in the first electrode layer 4 and the metal top layer 12, with each conductor pattern 16 connecting one of the bond pads 15 to one of the segments 11, 13, 14. Both the bond pads 15 and the conductor tracks 16 then have a relatively low electrical resistance. After deposition of the layer of electroluminescent material 6 and the second electrode layer 7, the bond pads 15 are exposed by means of laser ablation.

What is claimed is:

1. An electroluminescent patterned display screen having a transparent substrate, comprising:

a first, transparent electrode layer, a layer of insulating material in which windows exposing the first electrode layer are formed in accordance with a pattern to be displayed, a layer of an organic electroluminescent material which is provided on the layer of insulating material and, within the windows in the layer of insulating material, on the first electrode layer, and a second electrode layer which is provided on the layer of electroluminescent material, characterized in that the first electrode layer is provided with a top layer of metal on which the layer of insulating material is present, while the windows are formed both in the layer of insulating material and in the metal top layer.

2. A patterned display screen as claimed in claim 1, characterized in that a pattern of mutually isolated segments is formed in the first electrode layer and the metal top layer, and the windows in the insulating layer and the top layer are provided at the area of the segments.

3. A patterned display screen as claimed in claim 2, characterized in that the metal top layer and the layer of insulating material covers an edge of the segments.

4. A patterned display screen as claimed in claim 2, characterized in that a pattern of bond pads and conductor tracks is formed in the first electrode layer and the metal top layer, each conductor track connecting one of the bond pads to one of the segments.

5. A method of manufacturing an electroluminescent patterned display screen comprising:

providing a first, transparent electrode layer on a surface of a plane substrate, providing a layer of insulating material in which windows exposing the first electrode layer are formed in accordance with a pattern to be displayed, depositing a layer of an organic electroluminescent material on the layer of insulating material and, within the windows in the layer of insulating material, on the first electrode layer, and depositing a second electrode layer on the layer of electroluminescent material, characterized in that, prior to depositing the layer of insulating material, the first, transparent electrode layer is first coated with a metal top layer, whereafter the layer of insulating material is provided on the metal top layer, and subsequently the windows are formed in the layer of insulating material and also in the metal top layer.

6. A method as claimed in claim 5, characterized in that, after the first electrode layer is coated with the metal top layer, a pattern of mutually isolated segments is formed in the electrode layer and the metal top layer, between which segments the surface of the substrate is exposed, whereafter the layer of insulating material is deposited on and between the segments, and windows in accordance with the pattern to be displayed are formed at the area of the segments in the layer of insulating material.

7. A method as claimed in claim 6, characterized in that, when forming the windows, an edge of the segments is covered by the metal top layer and the layer of insulating material.

8. A method as claimed in claim 6, characterized in that a pattern of bond pads and conductor tracks is also formed in the first electrode layer and the metal top layer, with each conductor track connecting one of the bond pads to one of the segments.

* * * * *